US008882095B2

(12) United States Patent
Liu

(10) Patent No.: US 8,882,095 B2
(45) Date of Patent: Nov. 11, 2014

(54) HOOK PORTION OF CLAMP METER

(75) Inventor: Shao-Lin Liu, Taipei (TW)

(73) Assignee: Chung Instrument Electronics Industrial Co., Ltd., New Taipei (TW)

( * ) Notice: Subject to any disclaimer, the term of this patent is extended or adjusted under 35 U.S.C. 154(b) by 719 days.

(21) Appl. No.: 13/198,925

(22) Filed: Aug. 5, 2011

(65) Prior Publication Data
US 2013/0032983 A1 Feb. 7, 2013

(51) Int. Cl.
*B25B 1/00* (2006.01)
*G01R 15/18* (2006.01)
*G01R 1/22* (2006.01)
*G01R 15/12* (2006.01)

(52) U.S. Cl.
CPC .. *G01R 1/22* (2013.01); *G01R 15/12* (2013.01)
USPC .................................. 269/86; 269/3; 324/127

(58) Field of Classification Search
USPC .............. 269/143, 249, 6, 3, 95; 29/278, 257; 324/126, 127
See application file for complete search history.

(56) References Cited

U.S. PATENT DOCUMENTS 4,825,154 A * 4/1989 Cross et al. .................... 324/127
7,651,078 B2 * 1/2010 Geier et al. ....................... 269/6

* cited by examiner

*Primary Examiner* — Lee D Wilson
*Assistant Examiner* — Nirvana Deonauth
(74) *Attorney, Agent, or Firm* — Chun-Ming Shih; HDLS IPR Services

(57) ABSTRACT

A clamp meter has a main body and a stationary jaw fixed to an end of the main body. A hook portion of the clamp meter includes a movable jaw, a displacing means and a knob. The movable jaw is mounted on the main body corresponding to the position of the stationary jaw. The movable jaw and the stationary jaw together form a closed loop. The displacing means is mounted in the main body and comprises a displaceable rod connected to the movable jaw and a gear set for driving the displaceable rod. The knob is connected to the gear set for driving the displaceable rod and the movable jaw for linear displacement. The movable jaw is activated by the displaceable rod to generate a linear displacement, so that the user can operate the clamp meter more easily for measurement.

6 Claims, 6 Drawing Sheets

HOOK PORTION OF CLAMP METER

BACKGROUND OF THE INVENTION

1. Field of the Invention

The present invention relates to a multi-meter, and in particular to a clamp meter for measuring an alternating current (AC) or direct current (DC).

2. Description of Prior Art

A multi-meter or clamp meter is often used to measure a value of electric current or voltage. The clamp meter has an elongate main body, which is configured to be grasped by one hand of the user. Two jaws are provided on the front end of the clamp meter to surround an electric cable carrying an electric current, thereby detecting a magnetic field caused by the flowing of the electric current.

The conventional clamp meter includes a main body, a semi-circular stationary jaw and a semi-circular movable jaw. The stationary jaw and the movable jaw together form a closed loop. The movable jaw is pivotally connected to the main body with a trigger extending from one side of the main body. In use, a user presses the trigger by his/her finger, so that the movable jaw is rotatable by using the pivoting portion between the movable jaw and the main body as the center of rotation. An opening is formed at a connecting portion between the stationary jaw and the movable jaw. An electric cable carrying an electric current to be measured is disposed into the closed loop via the opening. By this arrangement, the value of electric current of the electric cable can be measured.

Although the conventional clamp meter can measure the electric current of various electronic products, the electric cable carrying an electric current is often hung in a higher position or disposed in a narrow space (such as an electrical housing). On the other hand, the distances between the respective electrical cables may be different in practice, and the electrical cables may be bent due to the spatial restriction. Thus, when the moveable jaw of the clamp meter needs to rotate to form an opening together with the stationary jaw, it is difficult for the movable jaw to rotate because the spatial restriction. As a result, the electrical cable to be measured cannot enter the opening, so that the operating range and locations of the conventional clamp meter are limited greatly.

SUMMARY OF THE INVENTION

The present invention is to provide a hook portion of a clamp meter, in which a movable jaw is activated by a displaceable rod to generate a linear displacement for easy measurement.

The present invention provides a hook portion of a clamp meter. The clamp meter has a main body and a stationary jaw fixed to an end of the main body. The hook portion includes a movable jaw, a displacing means and a knob. The movable jaw is located on the main body corresponding to the position of the stationary jaw. The movable jaw and the stationary jaw together form a closed loop. The displacing means is mounted in the main body. The displacing means comprises a displaceable rod connected to the movable jaw and a gear set for driving the displaceable rod to displace. The knob is connected to the gear set for driving the displaceable rod and the movable jaw for linear displacement.

The present invention has advantageous features as follow. Since the movable jaw generates a linear displacement rather pivotal rotation, the clamp meter can be used in a narrow space, so that the operating range and locations of the clamp meter are extended. By means of an elastic element, the movable jaw can return to its original state, which increases the convenience in use. The user can select various functions by switching the knob, which saves the components and thus reduces the cost.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
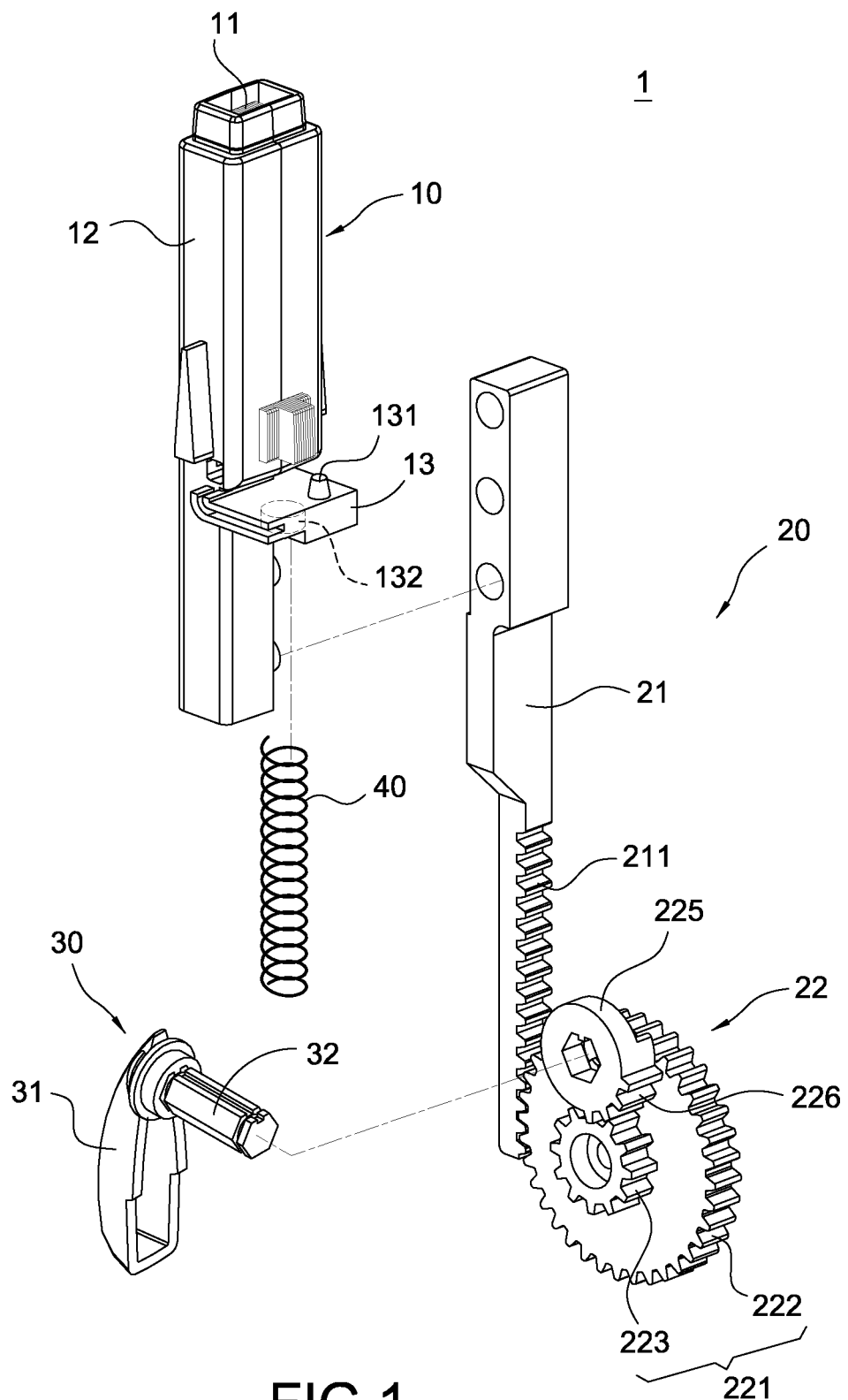
FIG. 1 is an assembled view showing a hook portion of the present invention.
Figure 2:
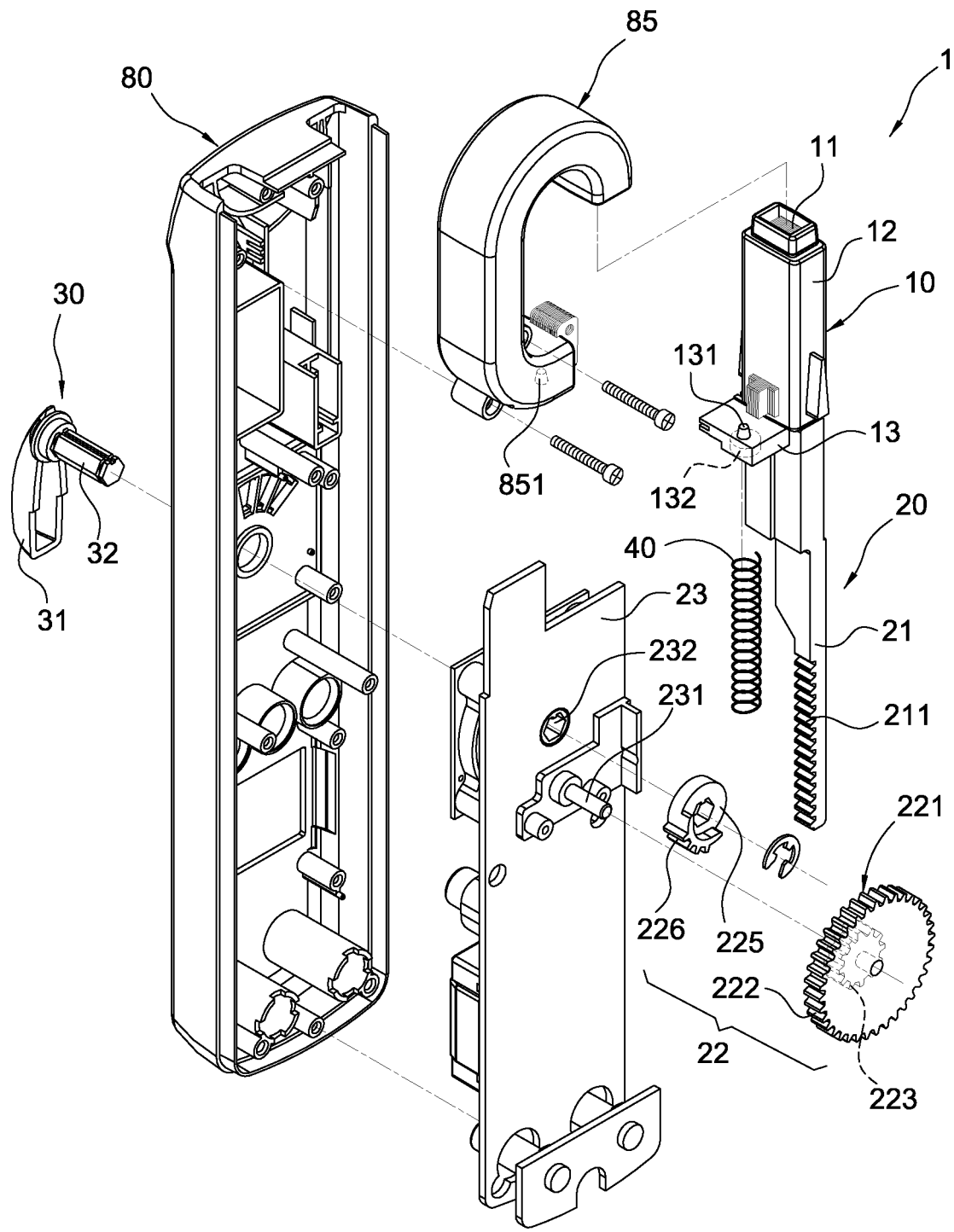
FIG. 2 is an exploded view showing the hook portion, a main body and a stationary jaw of the present invention.
Figure 3:
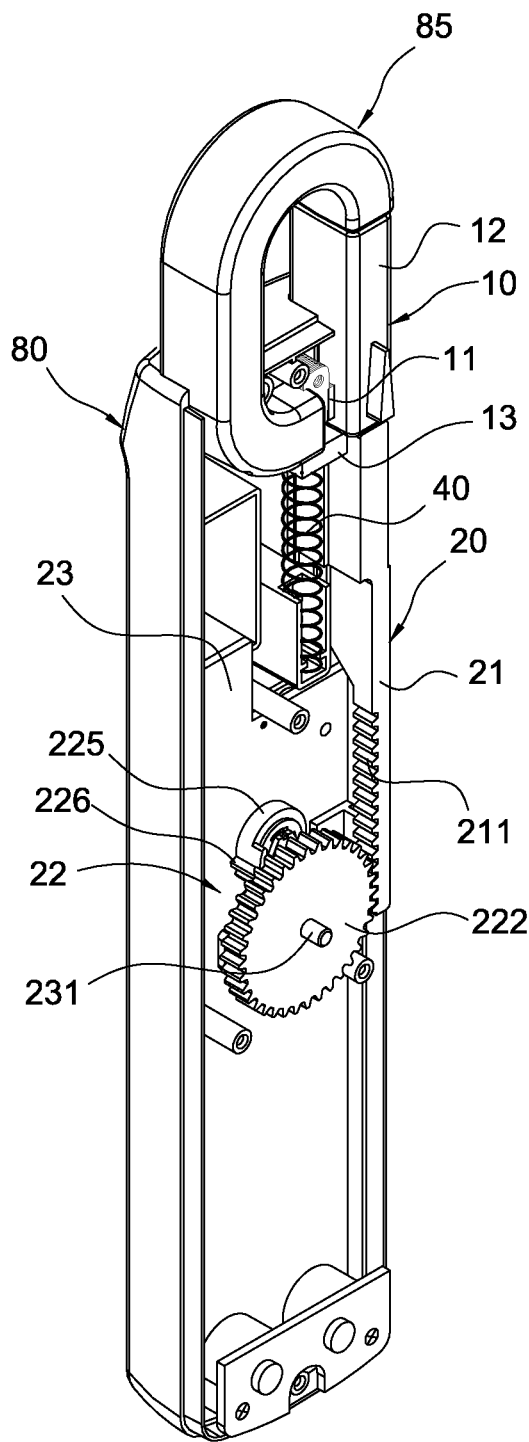
FIG. 3 is an assembled view showing the hook portion, the main body and the stationary jaw of the present invention.

Please refer to FIGS. 1 to 3. The present invention relates to a hook portion 1 of a clamp meter. The clamp meter 8 has a rectangular main body 80 and a C-shaped stationary jaw 85 connected to an end of the main body 80. The hook portion 1 of the present invention includes a movable jaw 10, a displacing means 20 and a knob 30.

The movable jaw 10 is mounted on the main body 80 corresponding to the position of the stationary jaw 85. The movable jaw 10 is formed into an I shape. The interior of the movable jaw 10 has a magnetic core 11 constituted by a plurality of silicon steel sheets. A casing 12 encloses the magnetic core 11. A transverse plate 13 extends from one side of the middle portion of the casing 12. A positioning post 131 protrudes from an upper end surface of the transverse plate 13. The lower end surface of the transverse plate 13 is provided with a positioning hole 132. The bottom end of the stationary hook 85 is provided with a pit 851 for allowing the positioning post 131 to be inserted therein. The movable jaw 10 and the stationary jaw 85 together form an O-shaped closed loop.

The displacing means 20 is mounted inside the main body 80 and includes a displaceable rod 21, a gear set 22 and a supporting plate 23. In the present embodiment, the displaceable rod 21 is a linear toothed rack. One end of the displaceable rod 21 is connected to the bottom of the movable jaw 10, and the other end thereof is provided with a plurality of teeth 211. The gear set 22 comprises a driven gear 221 and a ratchet wheel 225. The driven gear 221 is constituted of a bull gear 222 and a pinion 223. The pinion 223 is disposed on one side of the bull gear 222 and rotatable together with the bull gear 222. The driven gear 221 is pivotally mounted on the supporting plate 23 via a pivotal shaft 231 fixed to the supporting plate 23. The supporting plate 23 on one side of the pivotal shaft 231 is provided with a through-hole 232. The ratchet wheel 225 is disposed on one side of the driven gear 221 corresponding to the position of the through-hole 232. Peripheral teeth 225 of the ratchet wheel 225 are in transmission and engagement with the pinion 223.

The knob 30 comprises a trigger 31 and a rotary shaft 32 connected to one end of the trigger 31. The rotary shaft 32 is disposed through a through-hole 232 of the supporting plate 23 to be fixedly connected to the ratchet wheel 225.

The hook portion 1 of the present invention further includes an elastic element 40. In the present embodiment, the elastic element 40 is a spiral compression spring, but it is not limited thereto. The elastic element 40 is disposed in the main body 80. One end of the elastic element 40 abuts against the inner wall of the main body 80 as shown in FIG. 3, and the other end thereof is disposed into the positioning hole 132 of the transverse plate 13.

Figure 4:
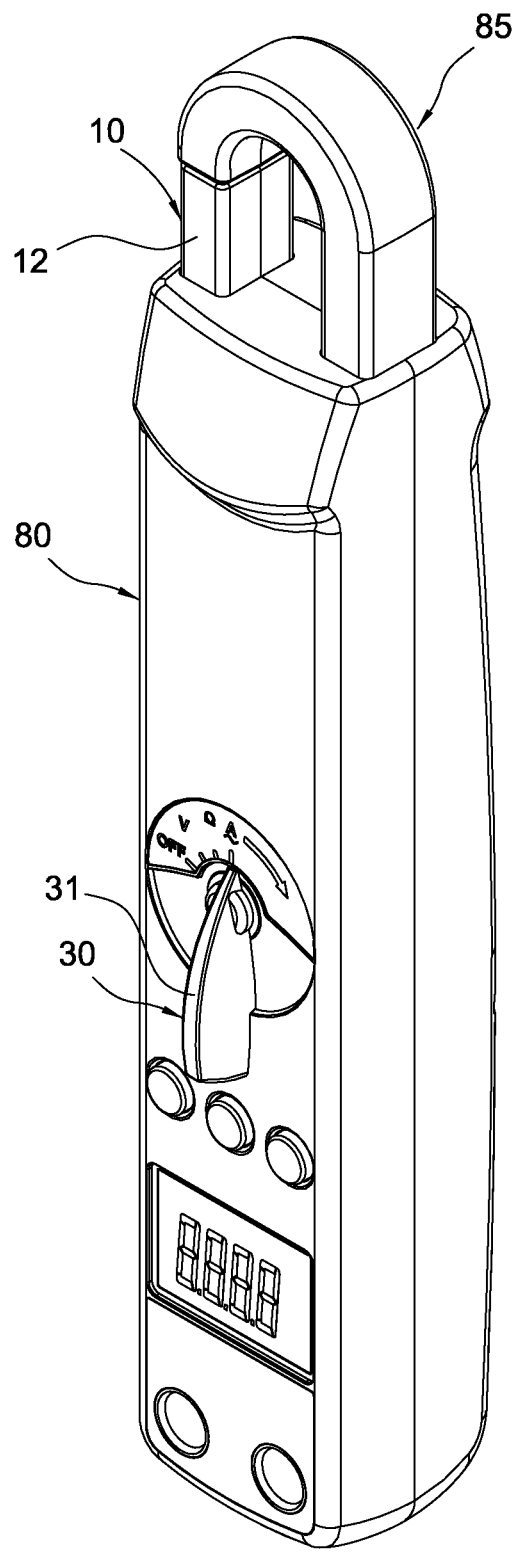
FIG. 4 is an assembled view showing that the hook portion of the present invention is applied to a clamp meter.
Figure 5:
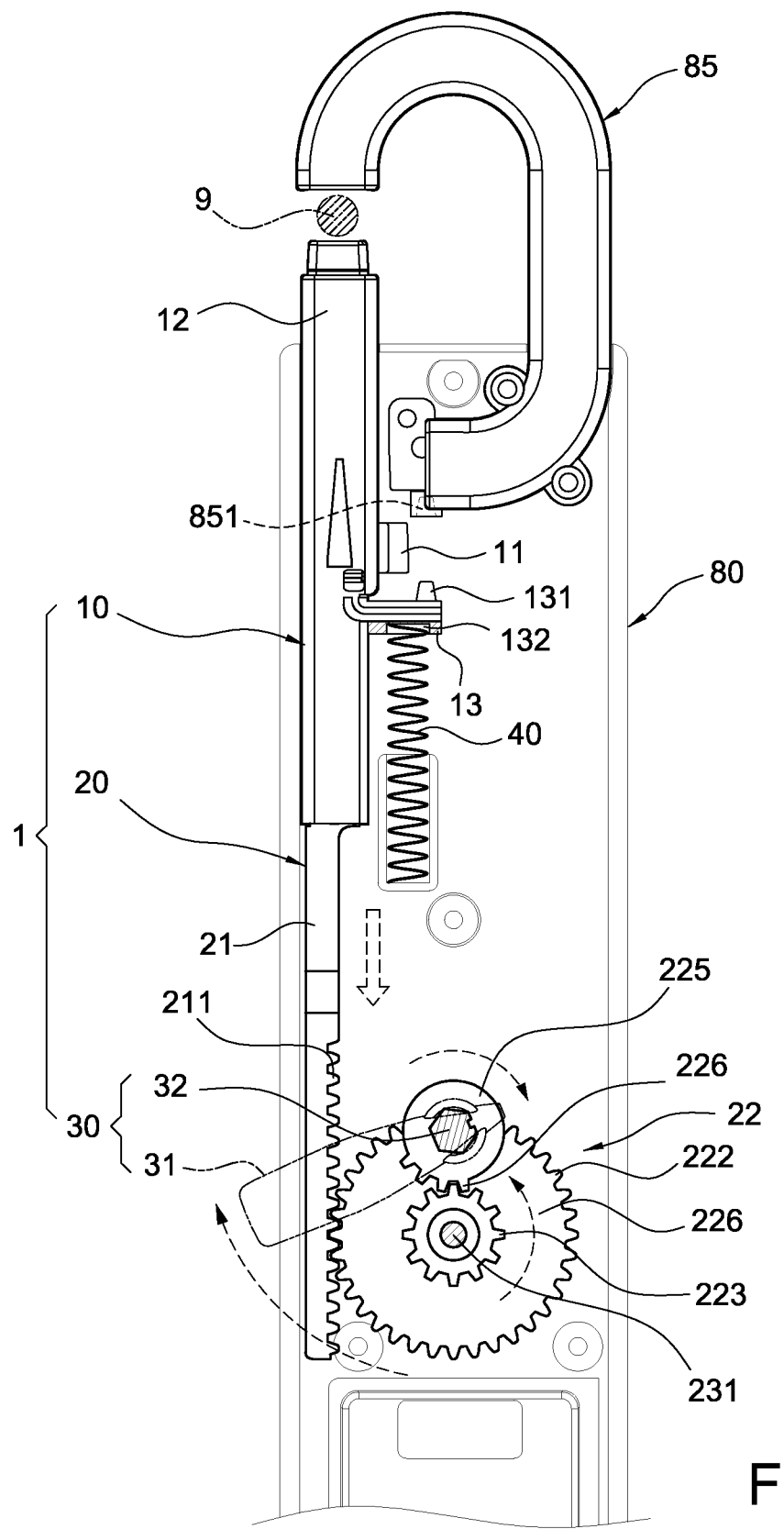
FIG. 5 is a schematic view (I) showing that the hook portion of the present invention is applied to a clamp meter.
Figure 6:
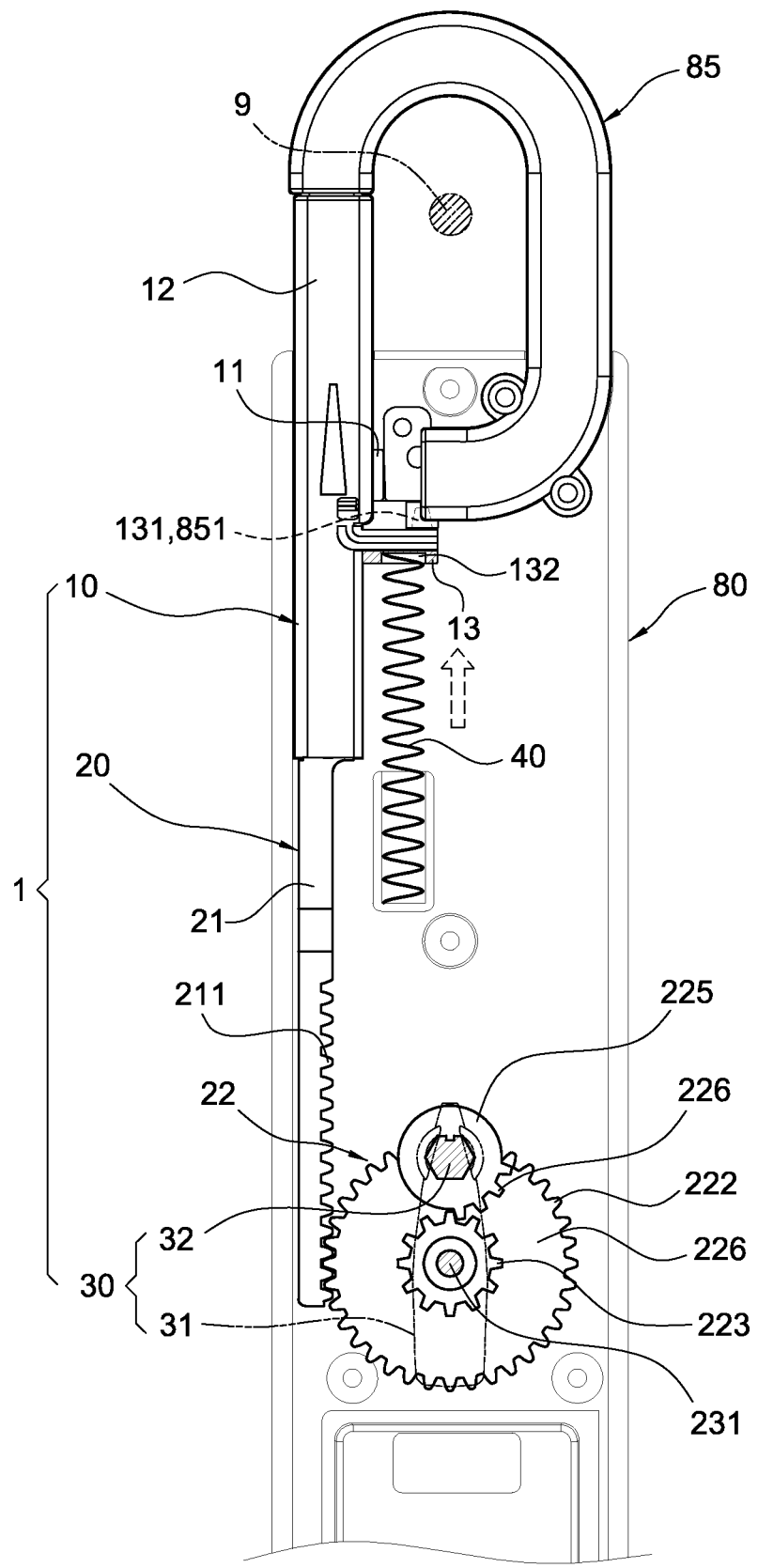
FIG. 6 is a schematic view (II) showing that the hook portion of the present invention is applied to a clamp meter.

Please refer to FIGS. 4 to 6. The above-mentioned components are combined with the main body 80 to form a clamp meter as shown in FIG. 4. In use, the user turns the trigger 31 to rotate clockwise, so that the rotary shaft 32 drives the ratchet wheel 225 to rotate therewith. At this time, the peripheral teeth 226 of the ratchet wheel 225 drive the pinion 223 of the driven gear 221 to rotate counterclockwise, so that the pinion 223 rotates together with the bull gear 222. The rotating bull gear 222 drives the displaceable rod 20 and the movable jaw 10 to displace linearly and downwardly. At this time, the elastic element 40 is subjected to a compression force. In this way, as shown in FIG. 5, an opening is formed at a connecting portion between the stationary jaw 85 and the movable jaw 10. The opening allows an electric cable 9 carrying an electric current to pass through. When the electric cable 9 carrying the electric current passes through the opening to enter the above-mentioned closed loop, the user releases the trigger 31, so that the elastic force of the elastic element 40 pushes the movable jaw 10 and the displaceable jaw 20 upwardly. As a result, the stationary jaw 85 and the movable jaw 10 again form a closed loop as shown in FIG. 6. Then, when the user turns the trigger 31 to rotate counterclockwise, as shown in FIG. 4, the user can select various functions of measuring an electric current, voltage and resistance of an object and switching the ON/OFF state of a power supply by using the knob 30.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A clamp meter comprising:
a main body;
a stationary jaw fixed to an end of the main body; and
a hook portion including:
   a movable jaw mounted to the main body at a position corresponding to the stationary jaw, the movable jaw and the stationary jaw forming a closed loop;
   a displacing means mounted in the main body, the displacing means comprising a displaceable rod connected to the movable jaw and a gear set for driving the displaceable rod to displace; and
   a knob connected to the gear set for driving the displaceable rod and the movable jaw for linear displacement,
wherein the displaceable rod is a linear toothed rack,
wherein the displacing means further comprises a supporting plate fixed to the main body, the gear set comprises a driven gear and a ratchet wheel, the driven gear is pivotally connected to the supporting plate via a pivotal shaft, and the ratchet wheel is connected to the knob, and
wherein the supporting plate on one side of the pivotal shaft is provided with a through-hole, the knob comprises a trigger and a rotary shaft connected to one end of the trigger, and the rotary shaft is disposed through the through-hole to be fixedly connected with the ratchet wheel.

2. The clamp meter according to claim 1, wherein the movable jaw comprises a magnetic core and a casing enclosing the magnetic core, a transverse plate extends from one side of the casing, a positioning post protrudes from an end surface of the transverse plate, and the stationary jaw is provided with a pit for allowing the positioning post to be inserted therein.

3. A clamp meter comprising:
a main body;
a stationary jaw fixed to an end of the main body; and
a hook portion including:
   a movable jaw mounted to the main body at a position corresponding to the stationary jaw, the movable jaw and the stationary jaw forming a closed loop;
   a displacing means mounted in the main body, the displacing means comprising a displaceable rod connected to the movable jaw and a gear set for driving the displaceable rod to displace; and
   a knob connected to the gear set for driving the displaceable rod and the movable jaw for linear displacement,
wherein the displaceable rod is a linear toothed rack,
wherein the displacing means further comprises a supporting plate fixed to the main body, the gear set comprises a driven gear and a ratchet wheel, the driven gear is pivotally connected to the supporting plate via a pivotal shaft, and the ratchet wheel is connected to the knob, and
wherein the driven gear comprises a bull gear and a pinion abutting the bull gear to rotate therewith, the bull gear is in transmission and engagement with the linear toothed rack, and the pinion is in transmission and engagement with the ratchet wheel.

4. The clamp meter according to claim 3, wherein the supporting plate on one side of the pivotal shaft is provided with a through-hole, the knob comprises a trigger and a rotary shaft connected to one end of the trigger, and the rotary shaft is disposed into the through-hole to be fixedly connected with the ratchet wheel.

5. The clamp meter according to claim 1, further including an elastic element, the movable jaw comprising a magnetic core and a casing enclosing the magnetic core, a transverse plate extending from one side of the casing, a positioning hole being provided on an end surface of the transverse plate, an end of the elastic element abutting the main body, and the other end thereof being disposed in the positioning hole.

6. The clamp meter according to claim 5, wherein the elastic element is a spiral compression spring.

* * * * *